(12) United States Patent
Choi

(10) Patent No.: US 12,428,601 B2
(45) Date of Patent: Sep. 30, 2025

(54) QUANTUM DOT ORGANIC LIGHT EMITTING DIODE

(71) Applicant: ELECTRONICS AND TELECOMMUNICATIONS RESEARCH INSTITUTE, Daejeon (KR)

(72) Inventor: Su Kyung Choi, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 864 days.

(21) Appl. No.: 17/699,392

(22) Filed: Mar. 21, 2022

(65) Prior Publication Data
US 2023/0096576 A1    Mar. 30, 2023

(30) Foreign Application Priority Data

Sep. 30, 2021   (KR) .......................... 10-2021-0129706

(51) Int. Cl.
*C09K 11/54* (2006.01)
*C01G 9/02* (2006.01)
(Continued)

(52) U.S. Cl.
CPC .............. *C09K 11/54* (2013.01); *C01G 9/02* (2013.01); *B82Y 20/00* (2013.01); *B82Y 30/00* (2013.01); *B82Y 40/00* (2013.01); *C01P 2004/64* (2013.01); *C01P 2006/60* (2013.01); *H10K 50/115* (2023.02); *H10K 50/84* (2023.02); *H10K 2102/00* (2023.02)

(58) Field of Classification Search
None
See application file for complete search history.

(56) References Cited

U.S. PATENT DOCUMENTS

| 2017/0018741 A1 | 1/2017 | Osawa |
| 2017/0110693 A1 | 4/2017 | Shin et al. |

(Continued)

FOREIGN PATENT DOCUMENTS

| KR | 20150141914 A | * 12/2015 |
| KR | 10-2016-0113217 A | 9/2016 |

(Continued)

OTHER PUBLICATIONS

Hyunji Park et al., "Quantum Dot Color Conversion Efficiency Improvement using Mixed Scattering Patricles", Optics and Photonics Congress 2021.

*Primary Examiner* — Tae H Yoon
(74) *Attorney, Agent, or Firm* — LRK PATENT LAW FIRM

(57) ABSTRACT

A quantum dot organic light-emitting diode according to an embodiment of the present disclosure may include a blue organic light-emitting diode (OLED) layer, a quantum dot color conversion layer which is provided on the blue OLED layer and has different scattering particle structures according to R, G and B colors, a color filter layer which is provided on the quantum dot color conversion layer and filters color other than the color that the color filter layer passes from the colors emitted by the quantum dot color conversion layer, and a coating layer provided on the color filter layer.

12 Claims, 8 Drawing Sheets

(51) Int. Cl.
  *B82Y 20/00* (2011.01)
  *B82Y 30/00* (2011.01)
  *B82Y 40/00* (2011.01)
  *H10K 50/115* (2023.01)
  *H10K 50/84* (2023.01)
  *H10K 102/00* (2023.01)

(56) References Cited

U.S. PATENT DOCUMENTS

2018/0034004 A1    2/2018  Chen
2019/0157354 A1    5/2019  Lee et al.
2020/0332186 A1*  10/2020  Kim ..................... C09K 11/54
2020/0388653 A1   12/2020  Lee et al.
2021/0151510 A1    5/2021  Lee et al.
2022/0093691 A1    3/2022  Kim et al.
2023/0005997 A1    1/2023  Lee et al.

FOREIGN PATENT DOCUMENTS

KR         10-1746722 B1       6/2017
KR         10-1925010 B1      12/2018
KR      10-2019-0058130 A      5/2019
KR      10-2019-0136490 A     12/2019
KR      10-2020-0097373 A      8/2020
KR      10-2020-0121430 A     10/2020
KR      10-2020-0140438 A     12/2020
KR      10-2021-0065245 A      6/2021
WO      WO 2018/220168 A2 *  12/2018

* cited by examiner

QUANTUM DOT ORGANIC LIGHT EMITTING DIODE

CROSS-REFERENCE TO RELATED APPLICATION

The present application claims priority to a Korean patent application 10-2021-0129706, filed Sep. 30, 2021, the entire contents of which are incorporated herein for all purposes by this reference.

BACKGROUND OF THE INVENTION

1. Field of the Invention

The present disclosure relates to a quantum dot organic light-emitting diode and, more particularly, to formation of a color conversion layer of the quantum dot organic light emitting diode.

2. Description of Related Art

Recently, the demand for the wide color gamut display is on the rise since it faithfully reproduces colors as close to nature as possible, and as an emerging next-generation display device candidate succeeding the organic light-emitting diode (OLED), the interest in the quantum dot (QD)-OLED display is increasing.

QD-OLED is a method of embodying subpixels of red (R), green (G) and blue (B) by forming a quantum dot color conversion layer on a blue OLED, and this method uses the principle that a color conversion layer composed of red and green quantum dots absorbs the light of blue OLED and re-emits as much light as the band gap energy of the quantum dots themselves.

When a quantum dot color conversion layer absorbs much blue light, quantum dots efficiently emit red or green again using the absorbed light. In addition, high color purity may be obtained when blue, which is a light source other than the converted color, is not emitted.

SUMMARY

In order to increase an amount of blue absorption in a quantum dot color conversion layer, there may be a method for increasing a quantum dot concentration, but the method has a limitation in increasing the concentration since it causes condensation of quantum dots, which leads to degradation of light-emitting property, or the dot-to-dot energy transfer decreases efficiency of reemission. Thus, the increase in such negative effects puts the limitation in increasing the concentration.

In order to improve the limitation, a method has been proposed to include a certain concentration of quantum dots, increase thickness or insert scattering particles into a quantum dot color conversion layer.

However, there is a problem that it is difficult to insert a certain or higher concentration of scattering particles into a color conversion layer, and there is another problem that stability of scattering is decreased and scattering particles are precipitated in a quantum dot color conversion solution, which results in stability degradation.

A technical object of the present disclosure is to provide a quantum dot organic light-emitting diode which has a structure capable of accomplishing high color conversion efficiency by using a low concentration of scattering particles.

Another technical object of the present disclosure is to provide a quantum dot organic light-emitting diode which has a structure capable of both improving blue light leakage and accomplishing high color conversion efficiency.

The technical objects of the present disclosure are not limited to the above-mentioned technical objects, and other technical objects that are not mentioned will be clearly understood by those skilled in the art through the following descriptions.

According to one aspect of the present disclosure, a quantum dot organic light-emitting diode may be provided. The quantum dot organic light-emitting diode may include a blue organic light-emitting diode (OLED) layer, a quantum dot color conversion layer which is provided on the blue OLED layer and has different scattering particle structures according to R, G and B colors, a color filter layer which is provided on the quantum dot color conversion layer and filters color other than the color that the color filter layer passes from the colors emitted by the quantum dot color conversion layer, and a coating layer provided on the color filter layer.

The features briefly summarized above with respect to the present disclosure are merely exemplary aspects of the detailed description below of the present disclosure, and do not limit the scope of the present disclosure.

According to the present disclosure, a quantum dot organic light-emitting diode may be configured to have a structure capable of accomplishing high color conversion efficiency by using a low concentration of scattering particles.

In addition, blue light leakage may be improved and high color conversion efficiency may also be achieved.

Effects obtained in the present disclosure are not limited to the above-mentioned effects, and other effects not mentioned above may be clearly understood by those skilled in the art from the following description.

DETAILED DESCRIPTION OF THE INVENTION

Figure 1:
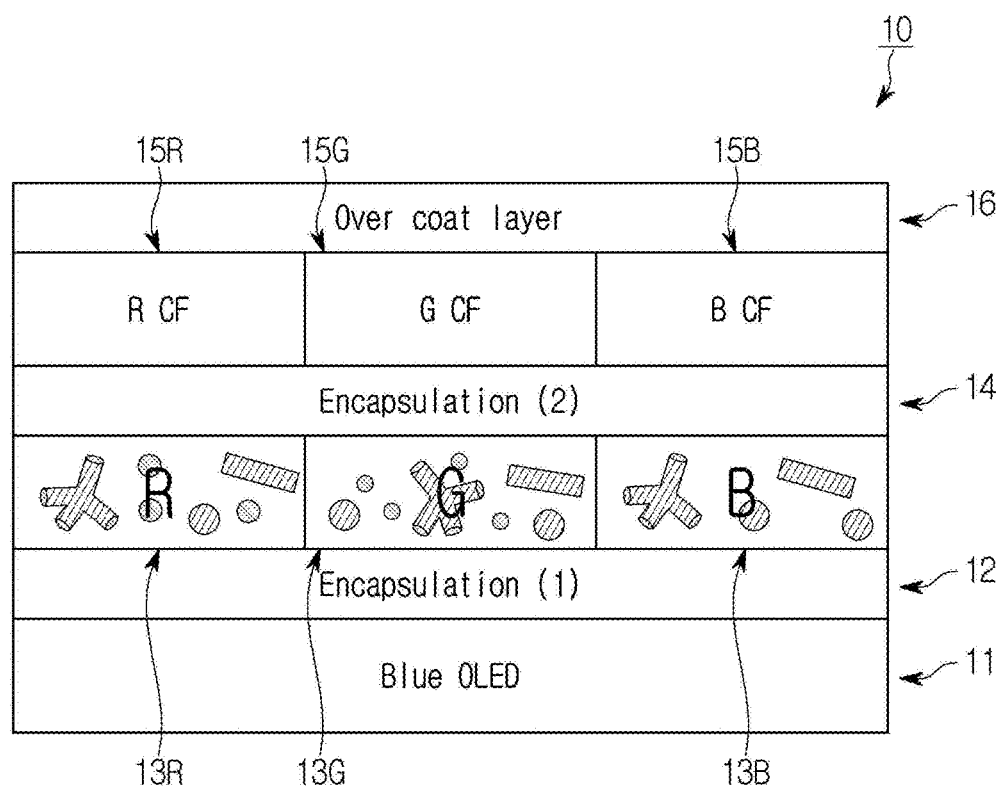
FIG. 1 is a view illustrating a structure of a quantum dot organic light-emitting diode according to an embodiment of the present disclosure.

Hereinafter, embodiments of the present disclosure will be described in detail with reference to the accompanying drawings, which will be easily implemented by those skilled in the art. However, the present disclosure may be embodied in many different forms and is not limited to the embodiments described herein.

In the following description of the embodiments of the present disclosure, a detailed description of known functions and configurations incorporated herein will be omitted when it may make the subject matter of the present disclosure rather unclear. In addition, parts not related to the description of the present disclosure in the drawings are omitted, and like parts are denoted by similar reference numerals.

In the present disclosure, when a component is referred to as being "linked", "coupled", or "connected" to another component, it is understood that not only a direct connection relationship but also an indirect connection relationship through an intermediate component may also be included. Also, when a component is referred to as "comprising" or "having" another component, it may mean further inclusion of another component not the exclusion thereof, unless explicitly described to the contrary.

In the present disclosure, components that are distinguished from each other are intended to clearly illustrate respective features. However, it does not necessarily mean that the components are separate. That is, a plurality of components may be integrated into one unit, or a single component may be distributed into a plurality of units. Thus, unless otherwise noted, such integrated or distributed embodiments are also included within the scope of the present disclosure.

In the present disclosure, components described in the various embodiments are not necessarily essential components, and some may be optional components. Accordingly, embodiments consisting of a subset of the components described in one embodiment are also included within the scope of the present disclosure. Also, embodiments that include other components in addition to the components described in the various embodiments are also included in the scope of the present disclosure.

Hereinafter, embodiments of the present disclosure will be described with reference to the accompanying drawings.

FIG. 1 is a view illustrating a structure of a quantum dot (QD) organic light-emitting diode according to an embodiment of the present disclosure.

Referring to FIG. 1, a quantum dot organic light-emitting diode 10 according to an embodiment of the present disclosure may include a blue organic light-emitting diode (OLED) layer 11, quantum dot color conversion layers 13R, 13G and 13B, color filter layers 15R, 15G and 15B, and a coating layer 16.

On the blue OLED layer 11, the red conversion layer 13R, the green conversion layer 13G and the blue conversion layer 13B may be formed in a predetermined size. In addition, the color filter layers 15R, 15G and 15B may be provided on the quantum dot color conversion layers 13R, 13G and 13B. Herein, the color filter layers 15R, 15G and 15B may be formed according to the sizes and positions of respective color conversion layers 13R, 13G and 13B. In addition, the coating layer 16 may be provided on the color filter layers 15R, 15G and 15B.

The quantum dot organic light-emitting diode 10 according to an embodiment of the present disclosure may further include a first encapsulation layer 12 and a second encapsulation layer 14. As an example, the first encapsulation layer 12 is provided on the blue OLED layer 11, the red conversion layer 13R, the green conversion layer 13G and the blue conversion layer 13B may be formed on the first encapsulation layer 12 in a predetermined size. In addition, the second encapsulation layer 14 may be formed on the quantum dot color conversion layers 13R, 13G and 13B, and the color filter layers 15R, 15G and 15B may be provided on the second encapsulation layer 14. Herein, the color filter layers 15R, 15G and 15B may be formed according to the sizes and positions of respective color conversion layers 13R, 13G and 13B. In addition, the coating layer 16 may be provided on the color filter layers 15R, 15G and 15B.

The first and second encapsulation layers 12 and 14 are layers for protecting the quantum dot color conversion layers 13R, 13G and 13B and may be formed by including a single layer or multiple layers of high-density inorganic thin film. In addition, the first and second encapsulation layers 12 and 14 may include multiple layers consisting of a combination of organic thin films or inorganic thin films. As an example, the first and second encapsulation layers 12 and 14 may consist of a layer combining at least one, two or more of $Al_2O_3$, $SiO_2$, $SiN_x$ and $SiO_xN_y$.

Particularly, it is preferable that the quantum dot organic light-emitting diode according to an embodiment of the present disclosure 10 be configured to have the quantum dot color conversion layers 13R, 13G and 13B with different scattering particle structures for each color.

Figure 2:
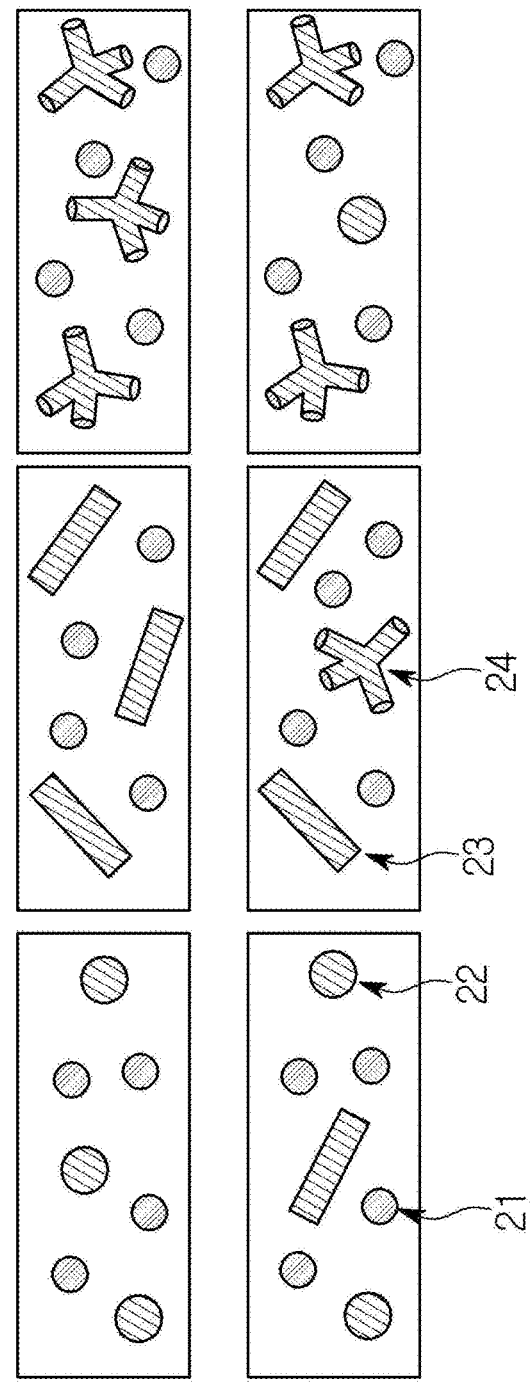
FIG. 2 is a view illustrating a structure of a quantum dot color conversion layer provided in a quantum dot organic light-emitting diode according to an embodiment of the present disclosure.

As an example, a scattering particle provided in the quantum dot color conversion layers 13R, 13G and 13B may include a quantum dot 21 (refer to FIG. 2) in a polymer matrix and may be formed by including a photoinitiator, an additive, a photoconversion resin, a monomer, and scattering particles 22, 23 and 24. Herein, the quantum dot 21 is a nanometer-sized semiconductor particle consisting of 2 compounds, either II-VI compounds or III-V compounds, or 3 compounds, that is, compounds, and may have a structure in which the core at the center is covered by a shell.

As an example, the manometer-sized semiconductor particle may include a particle which is formed by including a combination of a core and a shell or cores of cadmium selenide (CdSe), cadmium sulfide (CdS), cadmium telluride (CdTe), zinc sulfide (ZnS), zinc selenide (ZnSe), zinc telluride (ZnTe), zinc selenide telluride ($ZnSe_xTe_{1-x}$), indium phosphide (InP), indium arsenide (InAs), indium gallium phosphide (InGaP), silver indium sulfide ($CuInS_2$), and copper indium selenide ($CuInSe_2$).

Preferably, for the scattering particles 22, 23 and 24, an oxide particle with a material having a larger refractive index than that of polymer resin may be used. As an example, the scattering particles 22, 23 and 24 may include at least one of $TiO_2$, $ZnO$, $ZrO_2$, $BaTiO_3$, $BaSO_4$, and $Fe_2O_3$.

In addition, the scattering particles 22, 23 and 24 may be formed in a size ranging from dozens to hundreds of nanometers. Particularly, the scattering particles 22, 23 and 24 may have various shapes. As an example, the scattering particles 22, 23 and 24 may be formed in at least one shape of a sphere, a bar, a tetrapod, a cube, a star and a plate.

Although the present disclosure exemplifies a type of material or shape of a scattering particle but is not limited thereto, and various modifications are possible.

Referring to FIG. 1 again, the quantum dot color conversion layers 13R, 13G and 13B may include the red conversion layer 13R, the green conversion layer 13G, and the blue conversion layer 13B.

The red conversion layer 13R and the green conversion layer 13G may be conversion layers formed by coating and patterning by means of red and green quantum dot solutions, respectively, which include a mixed-aspect scattering particle. In addition, the blue conversion layer 13B uses an OLED light source itself generated from the blue organic light emitting diode 11 and thus may be formed to include no quantum dot. In addition, the blue conversion layer 13B may be formed by including the above-described scattering particle.

The color filter layers 15R, 15G and 15B may be formed to filter a blue light source, which leak without being converted in the quantum dot color conversion layers 13R, 13G and 13B, and to filter colors other than the color that each color filter layer passes from the colors emitted by the quantum dot color conversion layers 13R, 13G and 13B. In detail, the color filter layers 15R, 15G and 15B may filter color lights which is omnidirectionally luminous in a color conversion layer of a neighboring color, and then the color filter layers 15R, 15G and 15B may filter out colors other than the desired color. For instance, the color filter layer 15R on top of a red quantum dot color conversion layer 13R may filter out the green, blue light of adjacent pixels (adjacent color conversion layers) or blue light of blue OLED layer 11.

The coating layer 16 is a layer provided to protect the color filter layers 15R, 15G and 15B and may be formed through coating or vacuum evaporation of a predetermined solution.

Hereinafter, a structure of a quantum dot (QD) organic light emitting diode according to an embodiment of the present disclosure and a result of a comparative example will be described.

Figure 3A:
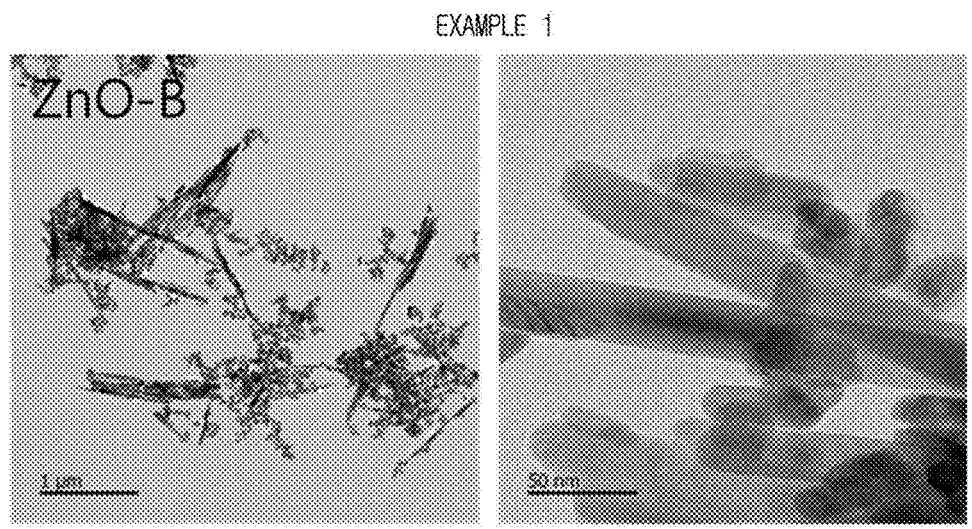
FIG. 3A is a view showing scattering particles of a color conversion layer formed according to Example 1.
Figure 3B:
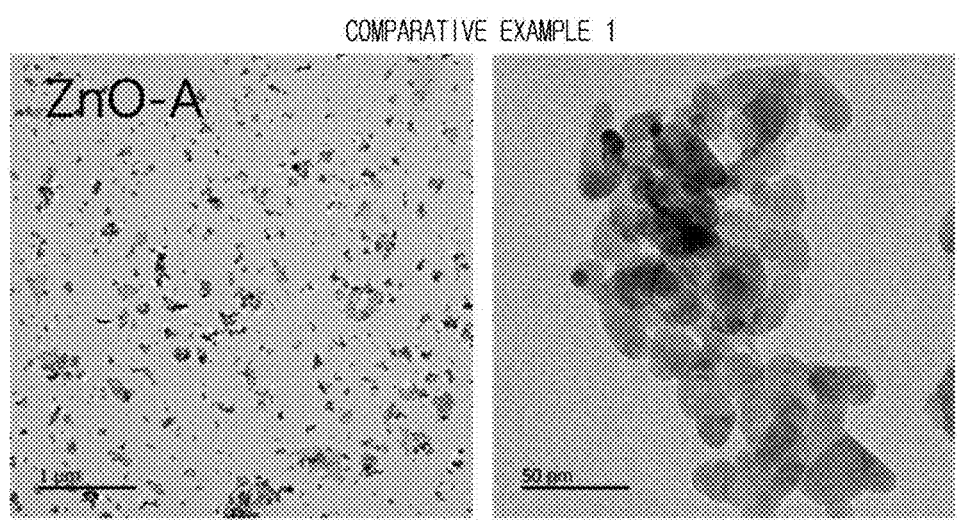
FIG. 3B is a view showing scattering particles of a color conversion layer formed according to Comparative Example 1.

FIG. 3A is a view showing scattering particles of a color conversion layer formed according to Example 1, and FIG. 3B is a view showing scattering particles of a color conversion layer formed according to Comparative Example 1.

Example 1

In Example 1, a quantum dot color conversion layer was fabricated using a red luminescence quantum dot.

A color conversion layer solution was based on a resin transparent in a visible light region and was formed by including a photoinitiator, an additive and a monomer. A matrix may be formed by UV curing. In addition, Example 1 formed a color conversion layer using ZnO—B that mixes a ZnO spherical particle and a ZnO bar particle.

Comparative Example 1

Like in Example 1 described above, in Comparative Example 1, a quantum dot color conversion layer was fabricated using a red luminescence quantum dot, and a color conversion layer solution was based on a resin transparent in a visible light region and was formed by including a photoinitiator, an additive and a monomer. A matrix was formed by UV curing.

However, when forming a color conversion layer, the color conversion layer was formed by ZnO-A using a scattering particle consisting of a single ZnO spherical particle.

In Example 1 and Comparative Example 1, in order to fabricate a quantum dot color conversion layer, a color conversion solution was made by mixing a scattering particle with UV curing type resin first and then adding a quantum dot. Next, a concentration of the quantum dot was fixed, and an effect was observed by changing a concentration of the scattering particle.

Figure 4A:
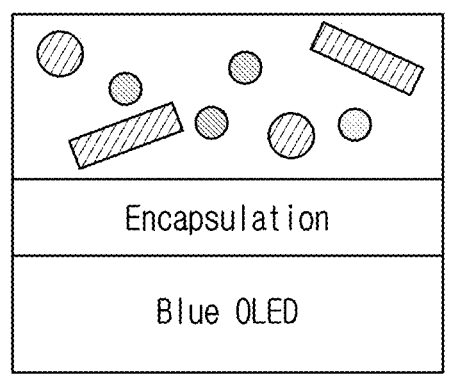
FIG. 4A is a view showing a structure of a color conversion layer formed according to Example 1.
Figure 4B:
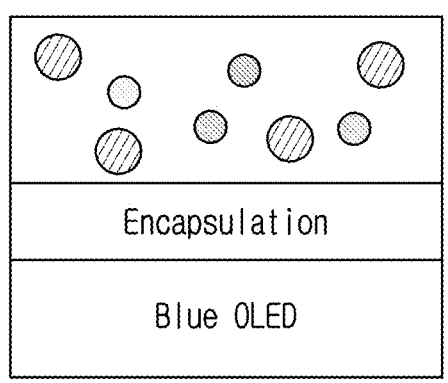
FIG. 4B is a view showing a structure of a color conversion layer formed according to Comparative Example 1.
Figure 5A:
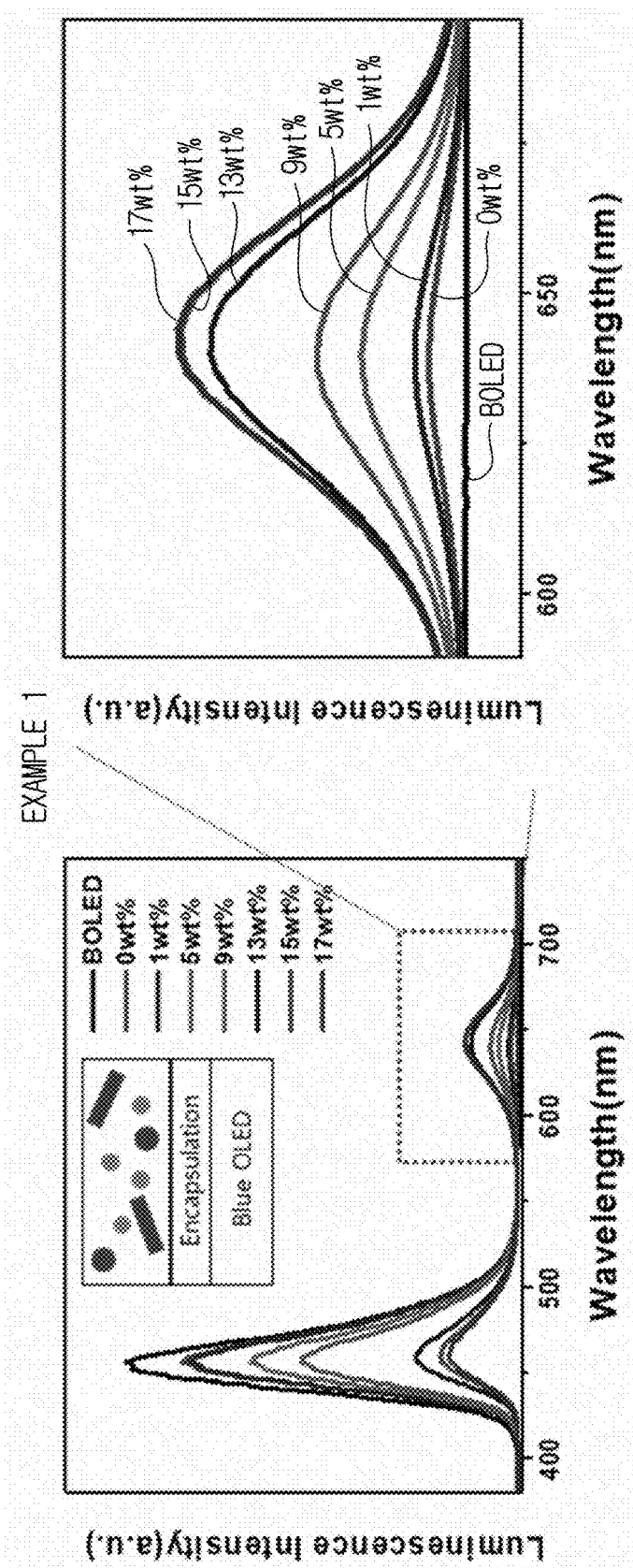
FIG. 5A is a view showing a luminescence spectrum of the quantum dot organic light-emitting diode of Example 1.
Figure 5B:
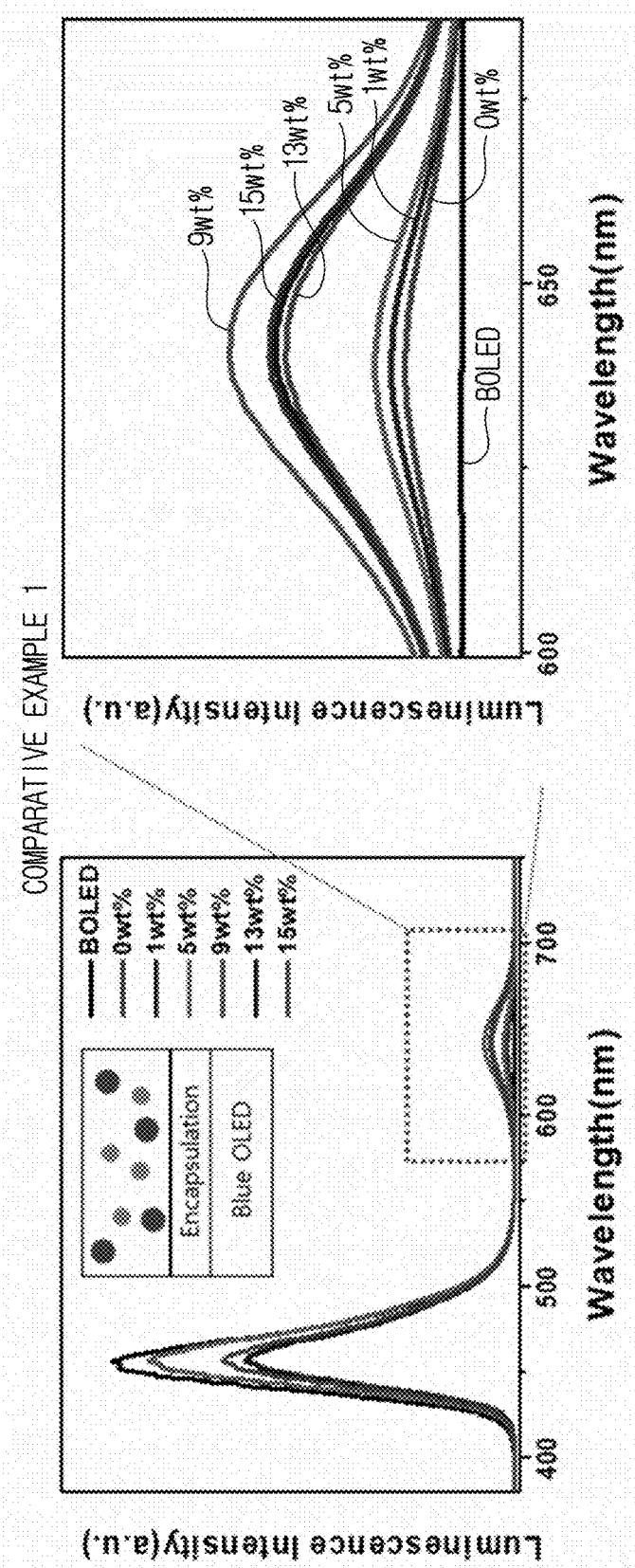
FIG. 5B is a view showing a luminescence spectrum of the quantum dot organic light-emitting diode of Comparative Example 1.

As an example, the color conversion layers of Example 1 and Comparative Example 1 may be schematically illustrated as in FIG. 4A and FIG. 4B respectively. Quantum dot organic light emitting diodes were formed by including the quantum dot color conversion layers formed by Example 1 and Comparative Example 1, and the luminescence spectra of the quantum dot organic light emitting diodes thus configured were measured. The measurement results are shown in FIG. 5A and FIG. 5B respectively.

Figure 6:
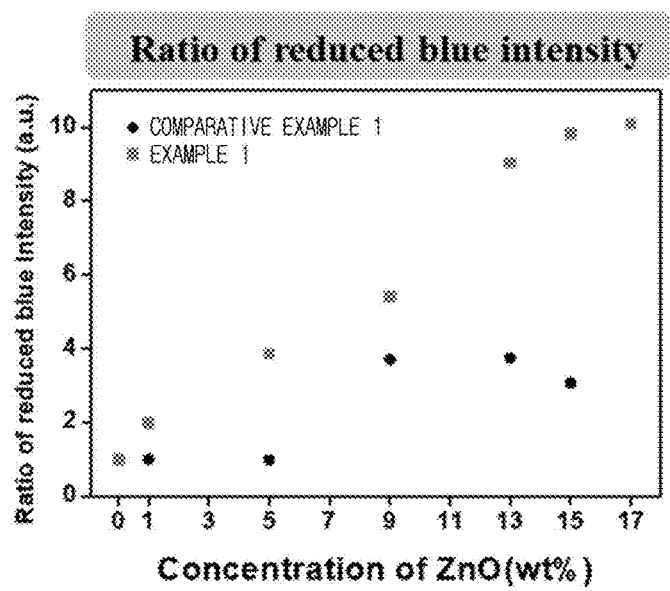
FIG. 6 shows reduction ratios of leaking blue light according to an increasing concentration of scattering particles in Example 1 and Comparative Example 1.
Figure 7:
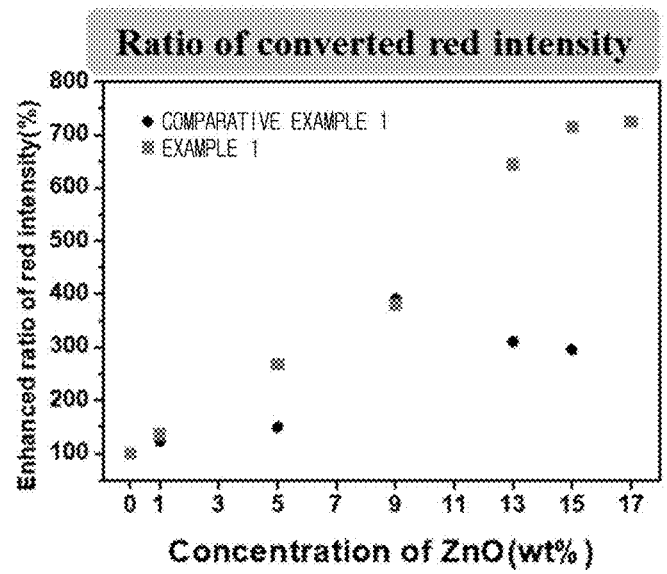
FIG. 7 shows increase ratios of red luminescence intensity according to an increasing concentration of scattering particles in Example 1 and Comparative Example 1.

In addition, reduction ratios of leaking blue light according to an increasing concentration of scattering particles were measured in Example 1 and Comparative Example 1, and the results are shown in FIG. 6. In addition, increase ratios of red luminescence intensity according to an increasing concentration of scattering particles were measured in Example 1 and Comparative Example 1, and the results are shown in FIG. 7.

According to FIG. 5A, FIG. 5B, FIG. 6 and FIG. 7 showing the results of Example 1 and Comparative Example 1, blue light corresponds to an electroluminescence spectrum of OLED, and red light corresponds to a fluorescence spectrum of a quantum dot. As the concentration of the scattering particle increases, the converted red intensity also increases (refer to FIG. 7). In addition, considering that every layer has a same quantum dot concentration, it may be confirmed that the scattering effect of an input blue light source increases along with an increase in the concentration of a scattering particle so that an optical path increases and thus the absorption rate of blue light source in the quantum dot increases (refer to FIG. 6). In addition, it may be confirmed that, as the amount of blue light source absorbed by a quantum dot increases, converted red fluorescence also increases. When the two examples are compared based on the concentrations of scattering particles, it may be confirmed that Example 1 using scattering particles with mixed shapes at a same concentration shows a similar or higher value of the converted red fluorescence intensity than Comparative Example 1 using scattering particles with a single shape. In addition, it may be confirmed that Example 1 using scattering particles with mixed shapes significantly reduces blue leakage in comparison with Comparative Example 1 using scattering particles with a single shape.

Example 2

In Example 2, a quantum dot color conversion layer was fabricated using a red luminescence quantum dot.

A color conversion layer solution was based on a resin transparent in a visible light region and was formed by including a photoinitiator, an additive and a monomer. A matrix may be formed by UV curing. In addition, Example 2 formed a color conversion layer using ZnO—B that mixes a ZnO spherical particle and a ZnO bar particle. In addition, a QD-OLED was fabricated by direct coating of the quantum color conversion layer formed in Example 2 on an OLED device.

Comparative Example 2

Like in Example 1 described above, in Comparative Example 2, a quantum dot color conversion layer was fabricated using a red luminescence quantum dot, and a color conversion layer solution was based on a resin transparent in a visible light region and was formed by including a photoinitiator, an additive and a monomer. A matrix was formed by UV curing. However, when forming a color conversion layer, the color conversion layer was formed by ZnO-A using a scattering particle consisting of a single ZnO spherical particle.

In addition, a QD-OLED was fabricated by direct coating of the quantum color conversion layer formed in Comparative Example 2 on an OLED device.

Figure 8:
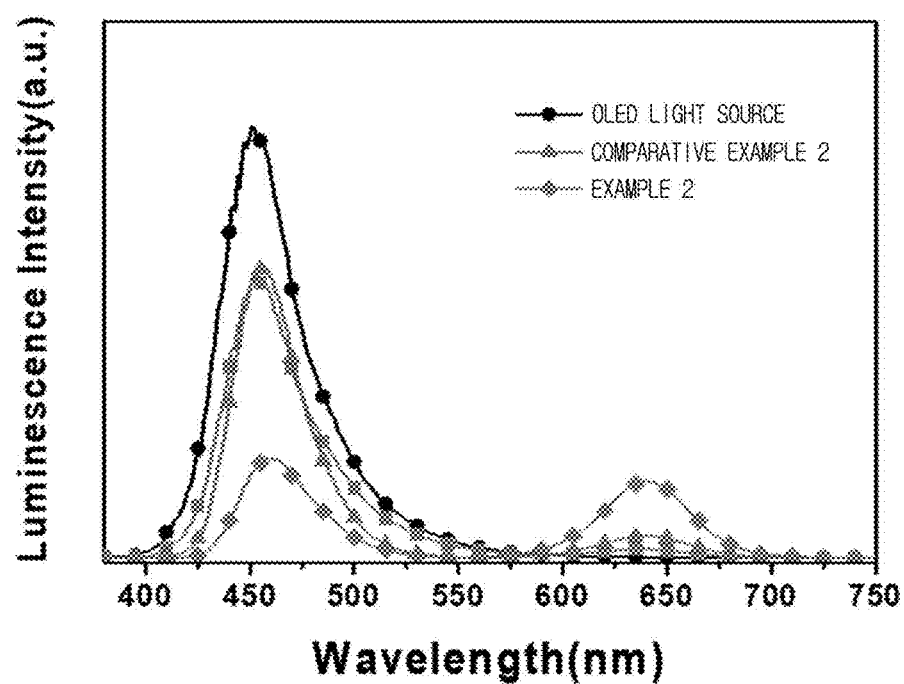
FIG. 8 shows a luminescence spectrum of a quantum dot organic light emitting diode with color conversion layers formed by Example 2 and Comparative Example 2.

Luminescence spectra were measured for the QD-OLEDs fabricated by Example 2 and Comparative Example 2, and FIG. 8 shows the result. Compared with Comparative Example 2 including a scattering particle, Example 2 using a mixed-aspect scattering particle shows a larger number of color conversions. Although the exemplary methods of the present disclosure are represented by a series of acts for clarity of explanation, they are not intended to limit the order in which the steps are performed, and if necessary, each step may be performed simultaneously or in a different order. In order to implement a method according to the present disclosure, the illustrative steps may include an additional step or exclude some steps while including the remaining steps. Alternatively, some steps may be excluded while additional steps are included.

The various embodiments of the disclosure are not intended to be all-inclusive and are intended to illustrate representative aspects of the disclosure, and the features described in the various embodiments may be applied independently or in a combination of two or more.

What is claimed is:

1. A quantum dot (QD) organic light-emitting diode (OLED) comprising:
    a blue organic OLED layer;
    a quantum dot color conversion layer which is provided on the blue OLED layer and has scattering particle structures that differ from one another among R, G and B colors;
    a color filter layer which is provided on the quantum dot color conversion layer and filters color other than the color that the color filter layer passes from the colors emitted by the quantum dot color conversion layer; and
    a coating layer provided on the color filter layer.

2. The quantum dot organic light-emitting diode of claim 1, wherein the quantum dot color conversion layer comprises a red conversion layer and a green conversion layer which have different scattering particle structures due to a quantum dot solution including a mixed-aspect scattering particle.

3. The quantum dot organic light-emitting diode of claim 2, wherein the red conversion layer and the green conversion layer are formed by coating or patterning with the quantum dot solution.

4. The quantum dot organic light-emitting diode of claim 2, wherein the quantum dot color conversion layer comprises a blue conversion layer including the mixed-aspect scattering particle.

5. The quantum dot organic light-emitting diode of claim 4, wherein the blue conversion layer is formed by resin including the mixed-aspect scattering particle.

6. The quantum dot organic light-emitting diode of claim 2, wherein the mixed-aspect scattering particle includes an oxide particle having a larger refractive index than a refractive index of polymer resin.

7. The quantum dot organic light-emitting diode of claim 6, wherein the oxide particle comprises at least one of $TiO_2$, ZnO, $ZrO_2$, $BaTiO_3$, $BaSO_4$, and $Fe_2O_3$.

8. The quantum dot organic light-emitting diode of claim 6, wherein the oxide particle comprises a particle formed in at least one shape of a sphere, a bar, a tetrapod, a cube, a star and a plate.

9. The quantum dot organic light-emitting diode of claim 1, further comprising:
    a first encapsulation layer between the blue organic light-emitting diode layer and the quantum dot color conversion layer; and
    a second encapsulation layer provided on the quantum dot color conversion layer.

10. The quantum dot organic light-emitting diode of claim 9, wherein the first and second encapsulation layers are formed by a single layer or multiple layers of high-density inorganic thin film.

11. The quantum dot organic light-emitting diode of claim 9, wherein the first and second encapsulation layers comprise at least one of $Al_2O_3$, $SiO_2$, $SiN_x$, and $SiO_xN_y$.

12. A quantum dot (QD) organic light-emitting diode (OLED) comprising:
    an OLED layer;
    a QD color conversion layer which is provided on the OLED layer and has scattering particle structures that differ from one another among R, G and B colors; and
    a coating layer provided on the QD color conversion layer.

* * * * *